(12) United States Patent
Hirler (10) Patent No.: US 7,329,921 B2
(45) Date of Patent: Feb. 12, 2008

(54) LATERAL SEMICONDUCTOR TRANSISTOR (75) Inventor: Franz Hirler, Isen (DE)

(73) Assignee: Infineon Technologies AG, Munich (DE)

(*) Notice: Subject to any disclaimer, the term of this patent is extended or adjusted under 35 U.S.C. 154(b) by 41 days.

(21) Appl. No.: 11/240,037

(22) Filed: Sep. 30, 2005

(65) Prior Publication Data
US 2006/0076621 A1 Apr. 13, 2006

(30) Foreign Application Priority Data
Sep. 30, 2004 (DE) .................. 10 2004 047 772

(51) Int. Cl.
H01L 29/76 (2006.01)
H01L 29/94 (2006.01)
H01L 31/00 (2006.01)

(52) U.S. Cl. .................. 257/330; 257/331; 257/332

(58) Field of Classification Search ........ 257/330–332, 257/328–329, 4, 220–221, 224, 302, 335, 257/122, 141
See application file for complete search history.

(56) References Cited

U.S. PATENT DOCUMENTS

| | | | |
|---|---|---|---|
| 4,796,070 A | 1/1989 | Black | |
| 5,438,215 A * | 8/1995 | Tihanyi | 257/401 |
| 6,072,215 A | 6/2000 | Kawaji et al. | |
| 6,498,382 B2 | 12/2002 | Hirler et al. | |
| 6,534,823 B2 * | 3/2003 | Hueting et al. | 257/330 |
| 6,696,323 B2 | 2/2004 | Yamaguchi et al. | |
| 6,717,230 B2 | 4/2004 | Kocon | |
| 6,734,496 B2 | 5/2004 | Fujihira | |
| 6,838,729 B2 * | 1/2005 | Schlogl et al. | 257/328 |
| 2002/0030237 A1 * | 3/2002 | Omura et al. | 257/397 |
| 2004/0018551 A1 | 1/2004 | Danenberg et al. | |
| 2004/0084724 A1 * | 5/2004 | Kapels et al. | 257/330 |
| 2004/0119091 A1 | 6/2004 | Suzuki et al. | |

* cited by examiner

Primary Examiner—Mary Wilczewski
Assistant Examiner—Thanh Y. Tran
(74) Attorney, Agent, or Firm—Dicke, Billig & Czaja PLLC (57) ABSTRACT

A lateral semiconductor transistor is disclosed. In one embodiment, the transistor includes a semiconductor body, in which a source region, a body region and a drain region, a drift region extending in the lateral direction between body region and drain region, and also a gate are formed. The gate is embedded within a trench formed in the semiconductor body and is configured to control vertical current flows between the source region and the drift region. The longitudinal orientation of the trench corresponds to the longitudinal orientation of the drift region.

15 Claims, 8 Drawing Sheets

LATERAL SEMICONDUCTOR TRANSISTOR

CROSS-REFERENCE TO RELATED APPLICATIONS

This Utility Patent Application claims priority to German Patent Application No. DE 10 2004 047 772.8, filed on Sep. 30, 2004, which is incorporated herein by reference.

FIELD OF THE INVENTION

The invention relates to a lateral semiconductor transistor having a semiconductor body, in which a source region, a body region and a drain region, a drift region extending in the lateral direction between body region and drain region, and a gate are formed, the gate being embedded within a trench formed in the semiconductor body and serving to control vertical current flows between source region and drift region.

BACKGROUND

Semiconductor transistors have a specific on resistivity $R_{on} \cdot A$ where $R_{on}$ is the resistance that the current has to overcome when flowing through the transistor, and A is the active chip area. The advantages of a low on resistivity are a low power loss of the transistor and, on the other hand, high possible current densities within the transistor.

In the case of lateral semiconductor transistors, the on resistivity $R_{on} \cdot A$ can be reduced by increasing the thickness of the drift region. In order to ensure that the lateral current flow flowing through the drift region utilizes the entire volume of the drift region equally, care must be taken to ensure that, at the start of the drift region, that is to say that part of the drift region which adjoins the body region, the current flow that emerges from the body region and enters the drift region is distributed as homogeneously as possible over the entire volume or the entire cross section of the drift region.

This problem area shall be explained in more detail below with reference to FIGS. 1 and 2.

Figure 1:
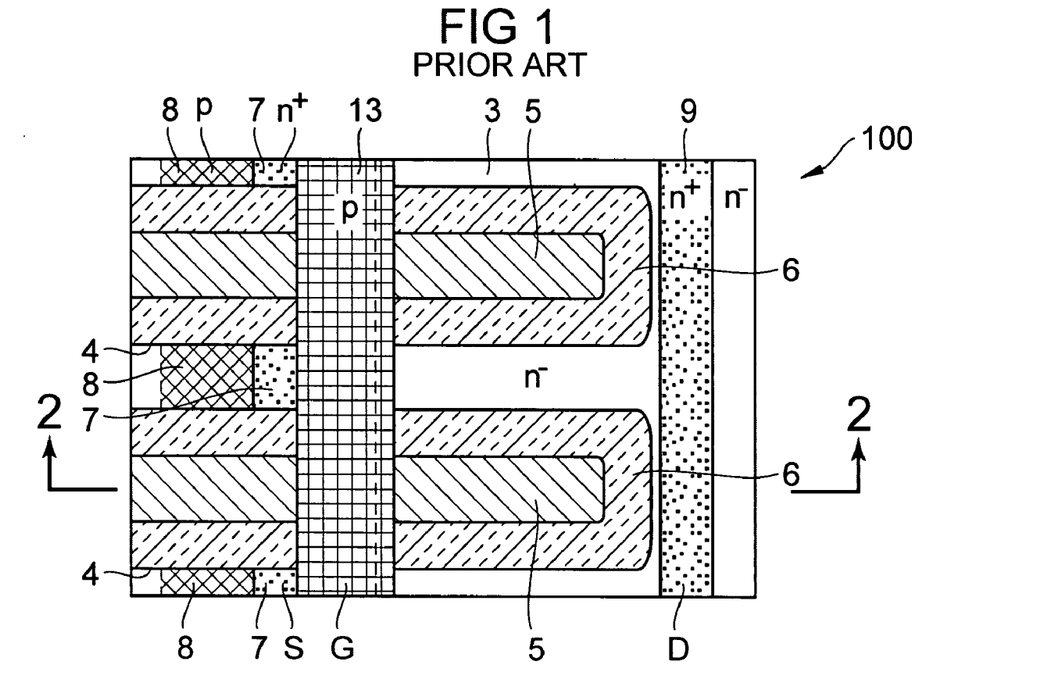
FIG. 1 illustrates a plan view of a first example of a known lateral semiconductor transistor.

FIG. 1 illustrates a lateral semiconductor transistor 100 having a semiconductor body 1, in which a $p^-$-doped substrate 2 and also an $n^-$-doped drift region 3 formed on the substrate 2 are provided. The drift region is pervaded by a plurality of laterally oriented trenches 4 in which a field electrode 5 isolated from the semiconductor body 1 by a corresponding insulation layer 6 is provided in each case. Between the trenches 4, $n^+$-doped source regions 7 and also p-doped body regions 8 are formed in the semiconductor body 1. An $n^+$-doped drain region 9 is provided in the semiconductor body 1. An insulation layer 10 pervaded by source terminals 11 and drain terminals 12 is applied on the semiconductor body 1. Furthermore, a gate 13 is provided, by means of which a lateral current flow can be generated from the source regions 7 through the body regions 8 into the drift region 3.

Figure 2:
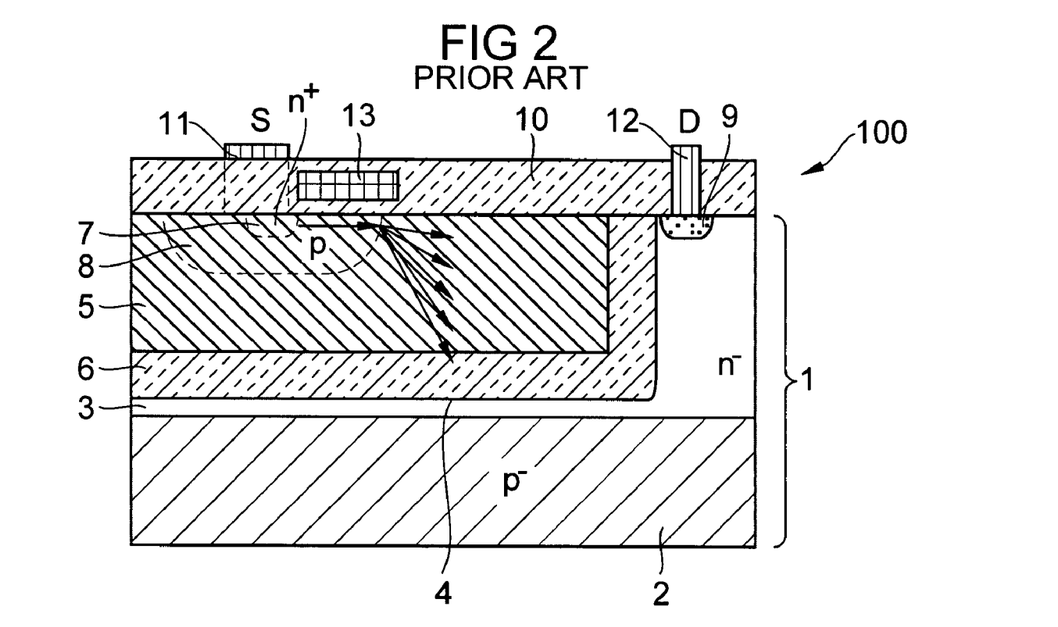
FIG. 2 illustrates a cross-sectional illustration of the semiconductor transistor illustrated in FIG. 1.

The lateral semiconductor transistor 100 illustrated in FIGS. 1 and 2 has the disadvantage that the channel resistance that the current has to overcome when passing through the body regions 8 is relatively high. Furthermore, only after entering the drift region 3 can the current flow expand over the entire volume of the drift region and thus contribute to a low on resistance. In other words, the high channel resistance that the current has to overcome within the body regions 8 once again negates the low drift resistance that the current has to overcome within the thickened drift region 3.

Furthermore, the lateral semiconductor transistor 100 illustrated in FIGS. 1 and 2 has a high "spreading resistance", which is to be understood to mean that resistance proportion of the on resistance $R_{on} \cdot A$ which the current has to overcome after entering the drift region 3 right into the expanded state into the depth of the drift region 3. In other words, the spreading resistance is the resistance proportion caused by the expansion of the current flow.

Figure 3:
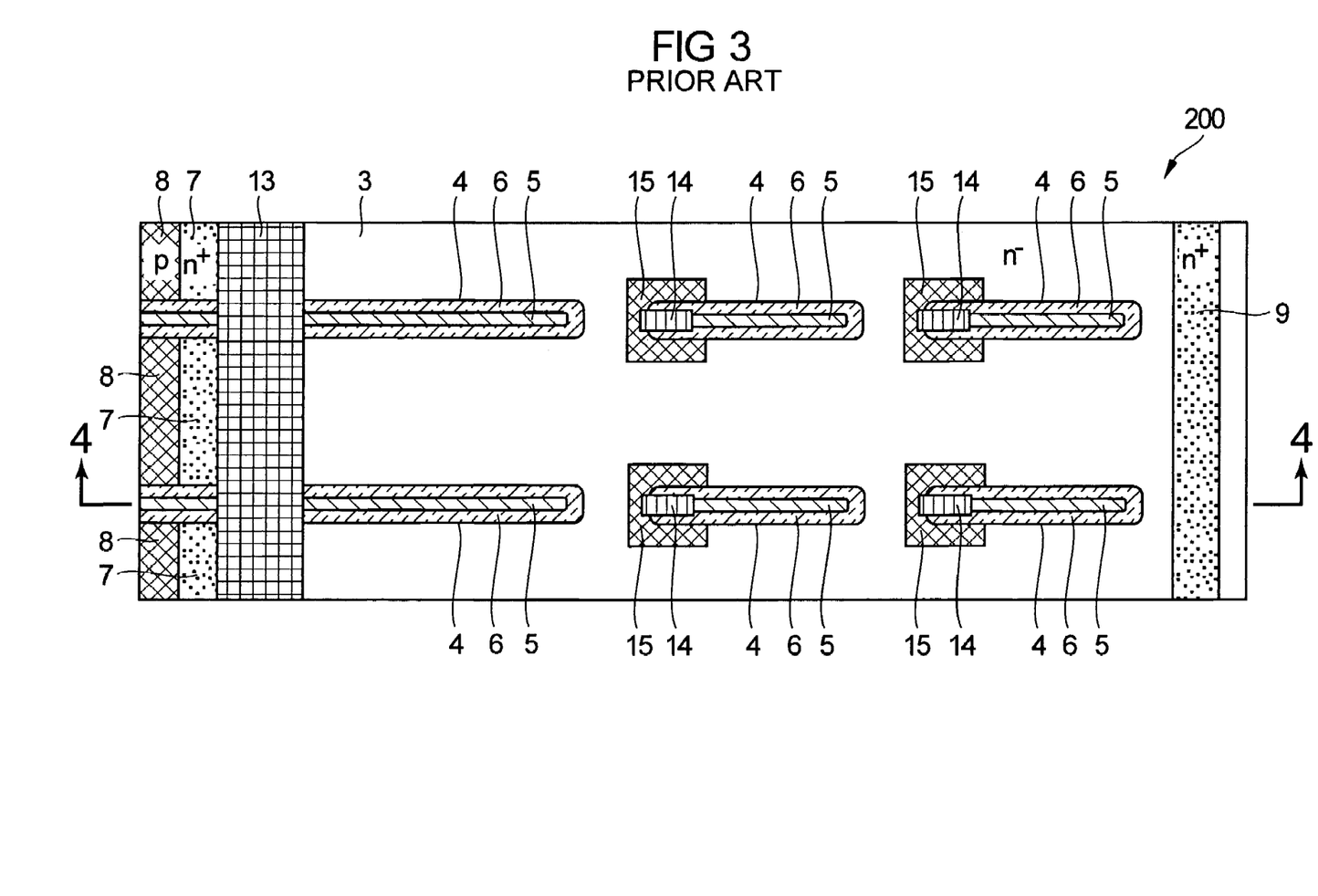
FIG. 3 illustrates a plan view of a second example of a known lateral semiconductor transistor.
Figure 4:
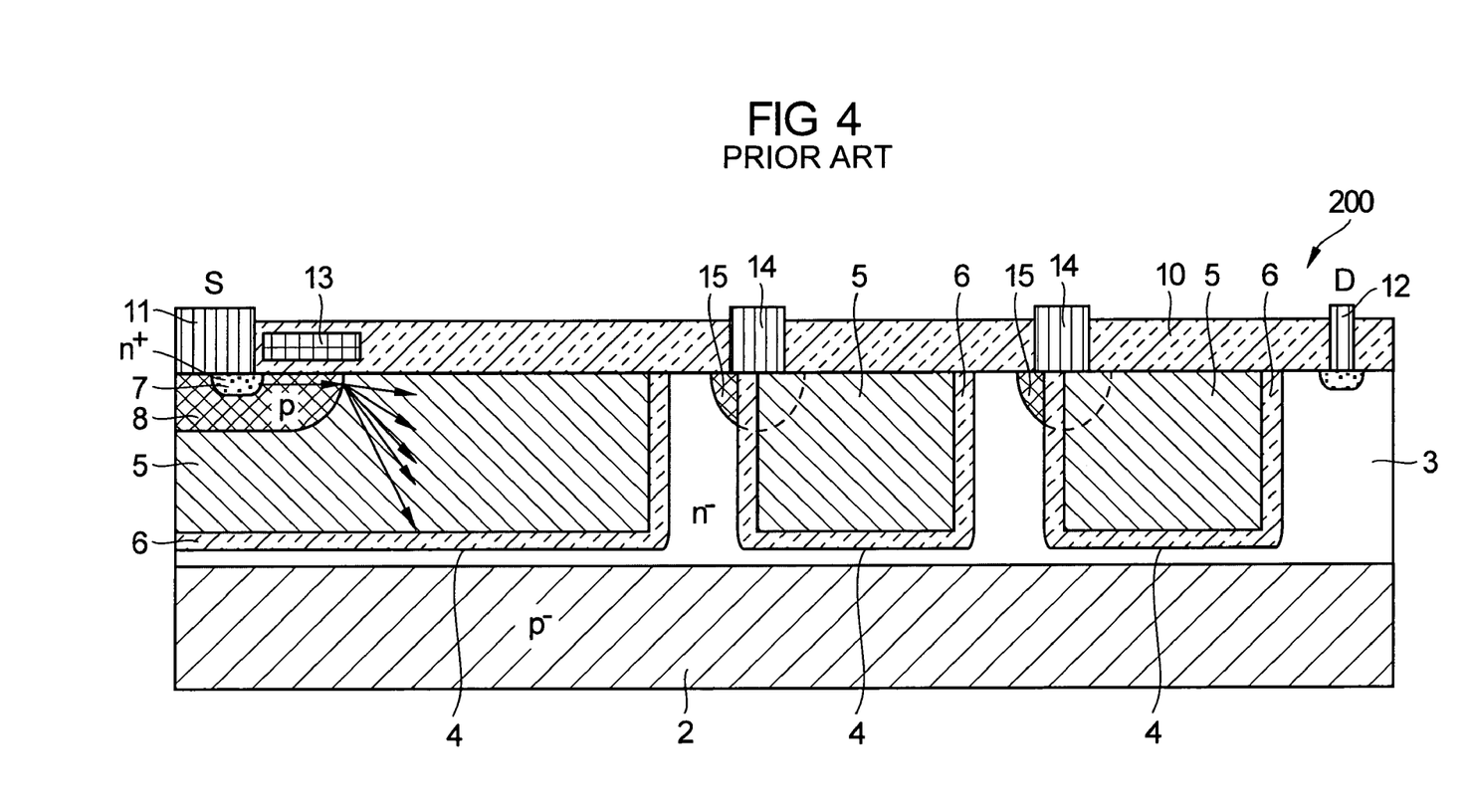
FIG. 4 illustrates a cross-sectional illustration of the semiconductor transistor illustrated in FIG. 3.

The lateral semiconductor transistor 200 illustrated in FIGS. 3 and 4 has a construction that is very similar to the construction of the lateral semiconductor transistor 100. The only difference is that the drift region 3 has a larger lateral extent and is pervaded by additional trenches 4/field electrodes 5. Each of the additional field electrodes 5 can be contact-connected from above via a field electrode terminal 14, the field electrode terminal 14 simultaneously making contact with p-doped compensation regions 15 which in each case enclose a part of the additional trenches 4. The lateral semiconductor transistor 200 has the same disadvantages that have been described above in connection with the lateral semiconductor transistor 100 (high channel resistance within the source regions 8, etc.).

Figure 6:
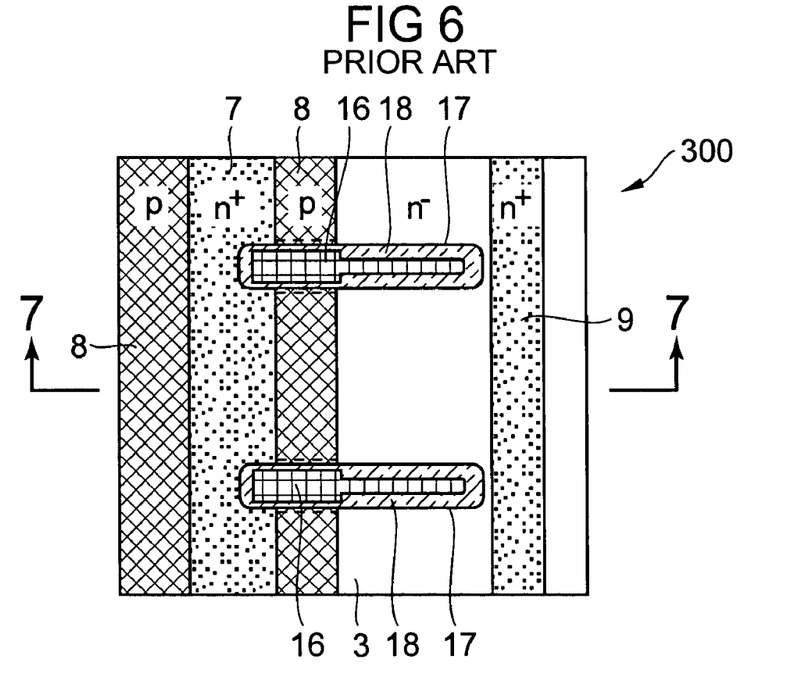
FIG. 6 illustrates a plan view of a fourth example of a known lateral semiconductor transistor.
Figure 7:
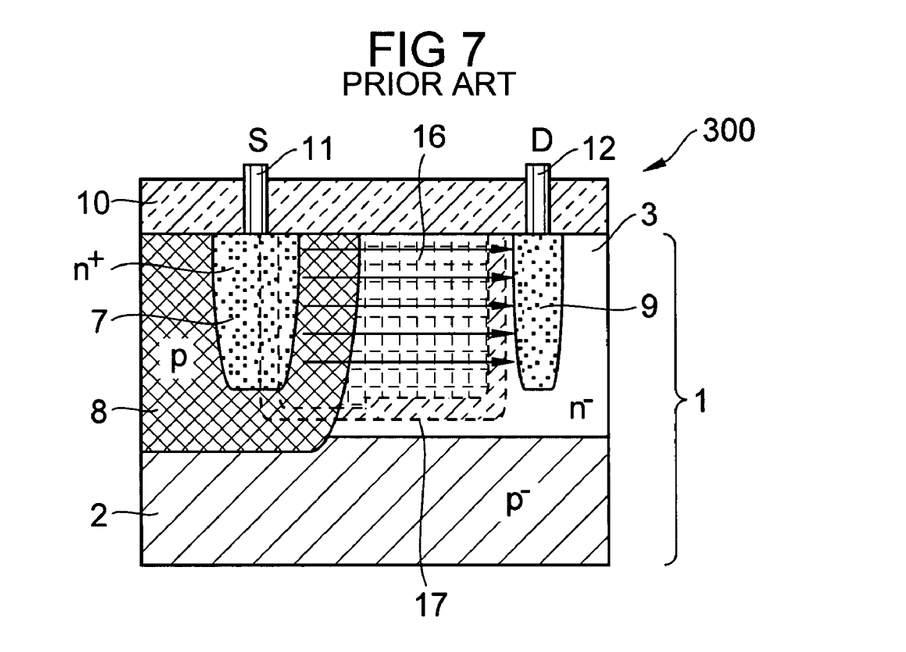
FIG. 7 illustrates a cross-sectional illustration of the semiconductor transistor illustrated in FIG. 6.

The lateral semiconductor transistor 300 illustrated in FIGS. 6 and 7 was proposed in order to avoid the disadvantages described above. An essential difference with respect to the lateral power transistors 100, 200 described above is that the gate 13 is replaced by a plurality of gates 16 which are formed in corresponding trenches 17 and are electrically insulated from the semiconductor body 1 by insulation layers 18. A further difference is that the source region 7, the body region 8 and also the drain region 9 reach deep into the semiconductor body 1. In this way, the current can emerge from the source region 7 in a manner distributed over a large area. On the one hand, the channel width within the body region 8 is thus increased. On the other hand, the volume or the cross section of the drift region 3 may already be fully exhausted from the outset. Both contribute to reducing the on resistivity.

The semiconductor transistor 300 illustrated in FIGS. 6 and 7 has the advantage over the semiconductor transistor 200 illustrated in FIGS. 3 and 4 that the spreading resistance already turns out to be relatively low. What is disadvantageous about the lateral semiconductor transistor 300 illustrated in FIGS. 6 and 7 is that the source regions 7 and body regions 8 projecting deep into the semiconductor body 1 can only be fabricated with a high outlay. Moreover, manufacturing tolerances in this regard are difficult to comply with.

In order to solve the problem area described above, it is known, as is illustrated in FIG. 5 (document U.S. Pat. No. 6,555,873 B2), to integrate a vertical trench transistor into a lateral semiconductor transistor 400, so that source and body regions projecting deep into the semiconductor body can be dispensed with.

Figure 5:
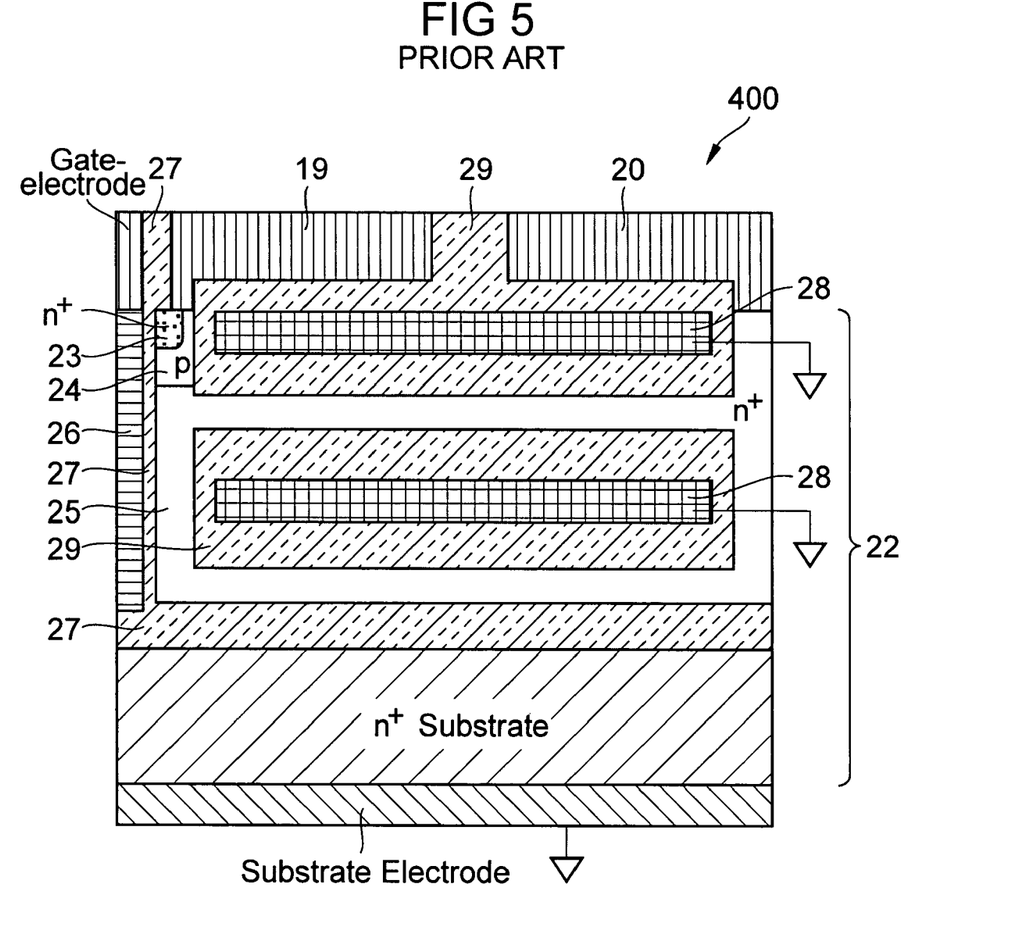
FIG. 5 illustrates a cross-sectional illustration of a third example of a known lateral semiconductor transistor.

A lateral semiconductor transistor 400 has a source electrode 19, a drain electrode 20 and also a substrate electrode 21, between which a semiconductor body 22 is provided. $n^+$-doped source regions 23, p-doped body regions 24, and also n-doped drift regions 25 are provided in the semiconductor body 22. The drift region 25 is pervaded by field electrodes 28 enclosed by insulation layers 29. Furthermore, a gate electrode 26 is provided, which is insulated from the semiconductor body 22 by an insulation layer 27 and by means of which it is possible to generate a vertical current flow from the source electrode 19 or the source region 23 through the body region 24 into the drift region 25. In this way, the electric current flow is distributed over the full cross section of the drift region 25 at the beginning of the latter. However, this embodiment, in contrast to the embodiment illustrated in FIGS. 6 and 7, does not require a deepened source region or deepened body region.

What is disadvantageous about the semiconductor transistor 400 illustrated in FIG. 5 is that the longitudinal orientation of the gate electrode 26 runs perpendicular to the longitudinal orientation of the drift region 25. The dimensions of the gate electrode 26 are thus limited, which means that the gate area of the gate electrode 26 that is available for the channel between source region 23 and drift region 25 is also limited (that is to say the channel width is limited). That proportion of the on resistivity which originates from the channel between source region 23 and drift region 25 can thus be reduced only to a certain extent. For these and other reasons, there is a need for the present invention.

SUMMARY

The present invention provides a lateral semiconductor transistor. In one embodiment, the lateral semiconductor transistor includes a semiconductor body, in which a source region, a body region and a drain region, a drift region extending in the lateral direction between body region and drain region; and a gate are formed. The gate is embedded within a trench formed in the semiconductor body, and is configured to control vertical current flows between source region and drift region, wherein the longitudinal orientation of the trench corresponds to the longitudinal orientation of the drift region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a lateral semiconductor transistor that can be produced in a simple manner, utilizes the drift region well and has a minimum on resistance.

In one embodiment, the semiconductor transistor according to the invention has a semiconductor body, in which a source region, a body region and a drain region, a drift region extending in the lateral direction between body region and drain region, and also a gate are formed. The gate is embedded within a trench formed in the semiconductor body and is configured to control vertical current flows between source region and drift region. The longitudinal orientation of the trench corresponds to the longitudinal orientation of the drift region.

In this embodiment, "longitudinal orientation of the drift region" is to be understood to mean, in particular, the direction in which the electric currents flow within the drift region after expansion.

In one embodiment, the drift region is pervaded by field electrodes which are provided within trenches formed in the semiconductor body and are insulated from the semiconductor body by insulation layers. In this embodiment, the longitudinal orientation of the trenches containing the field electrodes preferably corresponds to the longitudinal orientation of the drift region.

By virtue of the fact that the longitudinal orientation of the trench in which the gate is formed corresponds to the longitudinal orientation of the drift zone, the lateral extent of the vertical trench transistor including the source region, the body region, the drain region and also the gate can be chosen freely. It is thus possible to configure the width of the channel between source region and drain region arbitrarily. The channel width can be chosen to be very large if low on resistances are intended to be achieved in conjunction with high vertical current flows between source region and drift region. As a result of the parallel orientation of trench longitudinal orientation and drift region longitudinal orientation, it is accordingly possible to remove the hitherto existing upper limits with regard to the gate trench wall area and thus the channel width. However, a large channel width exhibits the disadvantage of the correspondingly high space requirement of the semiconductor transistor. Therefore, the length of the gate may alternatively be established in a range extending from half the depth to double the depth of the trenches into which the field electrodes are embedded, or from half the thickness to double the thickness of the drift region. The space requirement of the semiconductor transistor can thus be kept within limits.

A plurality of field electrodes may be arranged one next to the other and/or one above the other and/or one behind the other within a trench (with regard to the longitudinal orientation of the respective trench). By way of example, it is possible to provide trenches which extend over the entire longitudinal extent of the drift region and contain a plurality of mutually insulated field electrodes arranged one next to the other/one behind the other.

In another embodiment, the gate and at least one field electrode are formed in a common trench. In this embodiment, the gate and the field electrode are generally insulated from one another by an insulation layer.

As an alternative, it is possible to connect at least one gate and at least one field electrode within a common trench to gate potential. In this embodiment, at least one gate and at least one field electrode within a common trench are fused to form a common electrode.

In addition or as an alternative to the field electrodes, the drift region may contain compensation regions, that is to say semiconductor regions having complementary doping with respect to the doping of the drift region. The field electrodes and compensation regions may also be completely omitted, that is to say that the drift region may comprise a homogeneous semiconductor block (preferably doped homogeneously throughout).

The compensation regions may be formed as strips whose longitudinal orientation corresponds to the longitudinal orientation of the drift region.

As an alternative, the compensation regions may be formed in the form of a plurality of layers which are arranged one above the other and are separated from one another by layers of the complementary doping type which represent parts of the drift region.

A further possibility is for the compensation regions to be formed in the form of pillars whose longitudinal orientation runs perpendicular to the longitudinal orientation of the drift region.

If the compensation regions are formed as strips or layers, then these should be configured such that the charges present within a compensation region can be depleted.

If the compensation regions are formed as pillars, then the charges present within a compensation region must be incapable of being depleted. In the figures, identical or mutually corresponding regions, components or component groups are identified by the same reference numerals. Furthermore, all of the embodiments may be doped inversely, that is to say that n-type regions and p-regions may be interchanged with one another.

Figure 9:
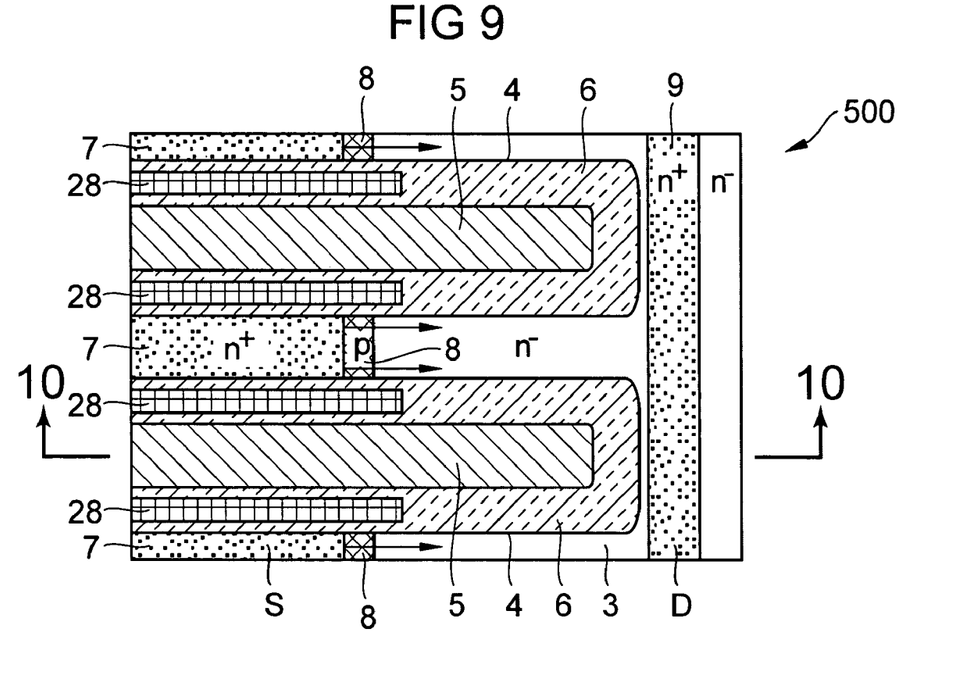
FIG. 9 illustrates a plan view of a first embodiment of the lateral semiconductor transistor according to the invention.

FIG. 9 illustrates one embodiment of a lateral semiconductor transistor 500 having a semiconductor body 1, in which a p$^-$-doped substrate 2 and also an n$^-$-doped drift region 3 formed on the substrate 2 are provided. The drift region is pervaded by a plurality of laterally oriented trenches 4 in each of which is provided a field electrode 5 which is isolated from the semiconductor body 1 by an insulation layer 6. Between the trenches 4, n$^+$-doped source regions 7 and also p-doped body regions 8 are formed in the semiconductor body 1. Furthermore, an n$^+$-doped drain region 9 is provided in the semiconductor body 1. An insulation layer 10 is applied on the semiconductor body 1, said insulation layer being pervaded by source terminals 11 and also drain terminals 12. Each field electrode 5 may be divided, as illustrated in FIGS. 3 and 4, into a plurality of field electrodes arranged one behind the other. The individual field electrodes may then be connected, as illustrated in FIGS. 3 and 4, to p-doped regions (reference symbols 15 in FIG. 3 and 4).

Figure 10:
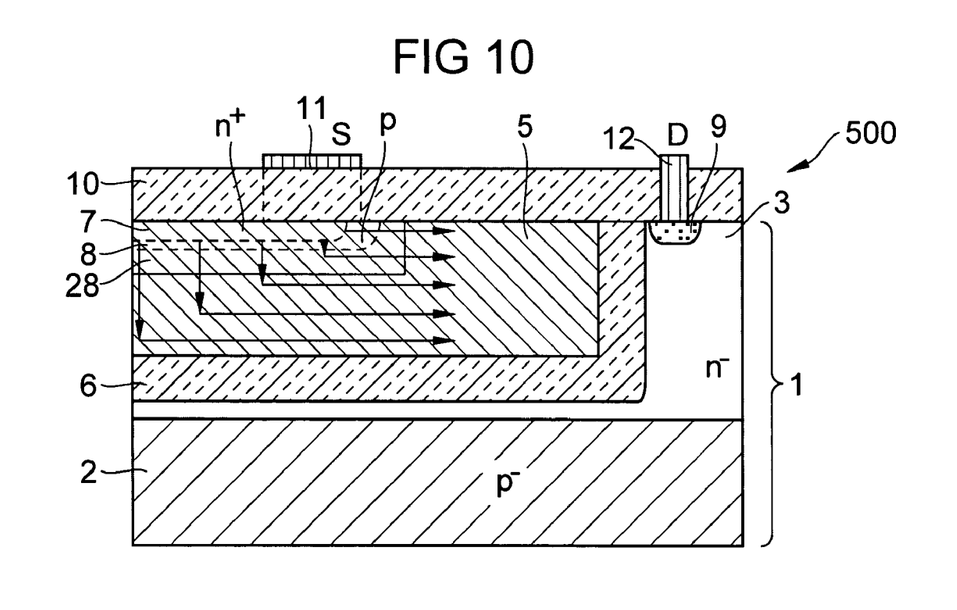
FIG. 10 illustrates a cross-sectional illustration of the semiconductor transistor illustrated in FIG. 9.

One difference between the semiconductor transistor 100 described in FIGS. 1 and 2 and the lateral semiconductor transistor 500 illustrated in FIGS. 9 and 10 is that the gate 13, which was provided within the insulation layer 10, that is to say which was situated above the semiconductor body 1, is replaced by a plurality of gates 28, formed within the trenches 4 which also contain the field electrodes 5. In this embodiment, the gates or gate electrodes 28 are embedded into the same insulation layers 6 which also enclose the field electrodes 5. The insulation layers 6 provide for sufficient insulation between the gates 28 and the field electrodes 5. The gates 28 and the field electrode 5 which are arranged within the same trench 4 may be fused to form a common electrode.

In one embodiment (not illustrated here), the arrangement of the field electrodes 5 described in connection with FIGS. 3 and 4 may be applied directly to the semiconductor 500 described in FIGS. 9 and 10. That is to say that a plurality of trenches 4 each containing at least one field electrode 5 may be provided, the trenches 4 being arranged one behind the other with regard to the longitudinal orientation of the drift region 3. The field electrodes 5 provided within the trenches 4 arranged one behind the other are preferably connected up in such a way that they are at different potentials when a reverse voltage is present. In a preferred embodiment, said field electrodes 5 are connected to floating semiconductor regions (reference number 15 in FIGS. 3 and 4) provided in the drift region 3.

As can be gathered from FIG. 10, the channel width between the source region 7 and the drift region 3 is larger than in the known lateral semiconductor transistors 100 to 400 described above. The channel width, which depends on the dimensions of the trench wall area of the trenches 4, can be configured with arbitrary magnitude since the lateral dimensions of the gate electrodes 28 are unrestricted, in principle. That proportion of the on resistivity which originates through the channel between source region 7 and drift region 3 can be significantly reduced in this way. Furthermore, the lateral current flow running from the body region 8 to the drain region 9 utilizes the full volume of the drift region 3.

Figure 11:
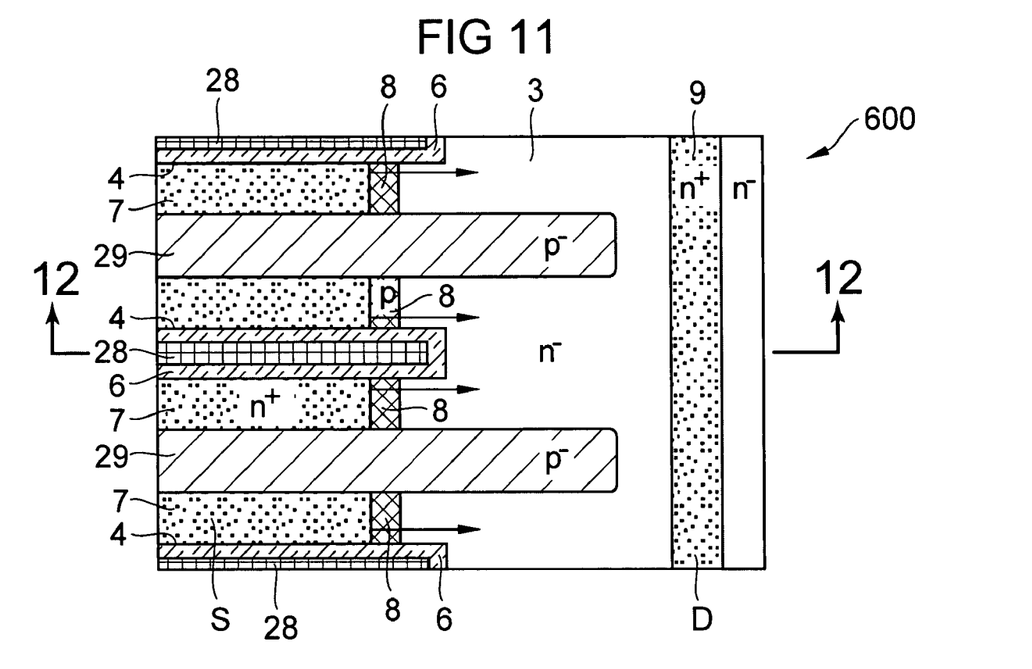
FIG. 11 illustrates a plan view of a second embodiment of the lateral semiconductor transistor according to the invention.
Figure 12:
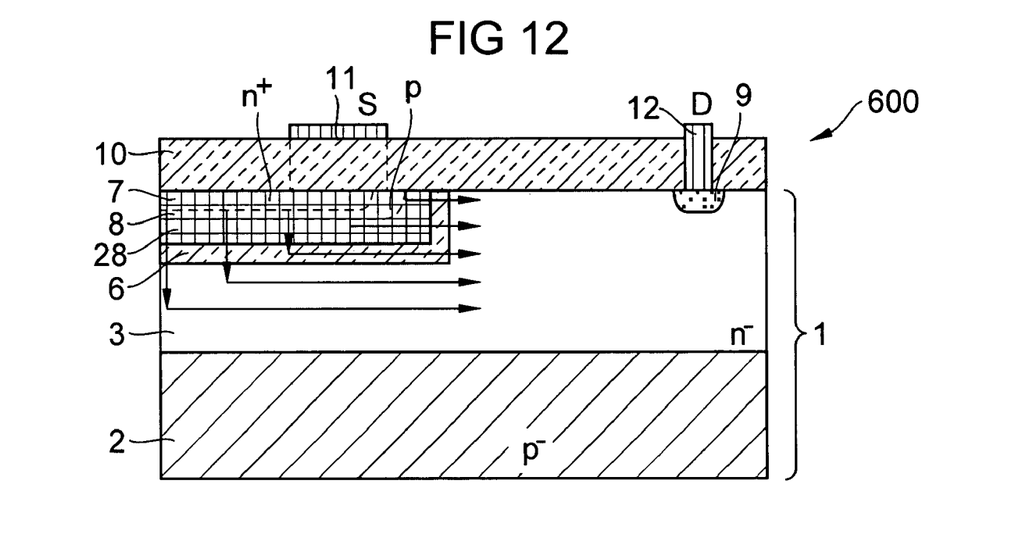
FIG. 12 illustrates a cross-sectional illustration of the semiconductor transistor illustrated in FIG. 11.

FIGS. 11 and 12 illustrate a further embodiment 600 of the lateral semiconductor transistor according to the invention. In this embodiment, the field electrodes 5 are replaced by semiconductor compensation structures (here: p-doped semiconductor regions) 29. The semiconductor compensation structures 29 have a similar form (plate form) to that of the field electrodes 5. Since only the gate electrodes 28 have to be accommodated in the trenches 4 in this embodiment, the dimensions of the trenches 4 turn out to be smaller, compared with the trenches 4 of the semiconductor transistor 500 illustrated in FIGS. 9 and 10.

Further aspects of the invention will be discussed in the following description.

In the case of lateral high-voltage transistors, the on resistivity $R_{on} \cdot A$ can be reduced with increasing drift path thickness. This applies to transistors both with an uncompensated and with a compensated drift path such as e.g. lateral field plate trench transistors or lateral super-junction transistors with vertically or laterally stratified p-type and n-type pillars. Since the source contacts are situated at the surface of the semiconductor body, the current has to be distributed "efficiently", that is to say with a low on resistivity $R_{on} \cdot A$, into the depth in order to be able to utilize the advantages of a thicker drift path. A planar MOS channel at the surface, as illustrated in FIG. 1, is not sufficient for this purpose, since the channel resistance itself is very high and the current, after emerging from the channel, first has to expand and be distributed into the depth, which is manifested in an increased spreading resistance. In this case, "spreading resistance" is to be understood to mean that resistance proportion of the resistivity which has to be overcome for the distribution of the current, proceeding from the channel end over the entire depth of the drift region.

This problem can be alleviated by means of a lateral trench sidewall channel (FIGS. 6, 7), in which the MOS channel is formed at the sidewall of a trench over the entire depth and the current distribution into the depth is effected by means of highly doped or metallic regions. The current flows laterally through the channel. In this case, the body and source regions extend over the entire depth or a large part of the trench depth. Since the threshold voltage is intended to be constant over the depth, body and source dopings have to be implemented with high accuracy over the depth. Production steps required for this purpose, such as outdiffusion from trenches, implantation into trench sidewalls and introduction of the dopant regions as bubbles in different depths, lead, however, to additional threshold voltage fluctuations that cannot be tolerated for many applications. Moreover, higher production costs arise on account of the additional production steps. In order to obtain an acceptable avalanche strength of the transistor, a highly doped $p^+$-type region that leads out deeply is furthermore required, which once again increases the costs.

The invention uses a vertical trench transistor with vertical current flow for controlling the current flow geometry. The channel induced through the vertical trench transistor advantageously runs at the trench wall in the direction of the drain region, since the channel width can be set arbitrarily in this way. At the same time, current emerges from the channel over a large width, with the result that "current crowding" which increases the spreading resistivity, is prevented. The lateral current flow can additionally be utilized at the lateral ends of the body region.

The invention thus uses trench blocks of a vertical field plate transistor in a lateral field plate transistor. If gate potential is applied to the field electrode, an accumulation channel is formed which reduces the on resistivity $R_{on} \cdot A$ through more efficient current distribution into the depth of the semiconductor body. At the same time, the field plates deplete the high doping of an epitaxial layer and thus enable a sufficient blocking capability of the transistor.

Figure 8:
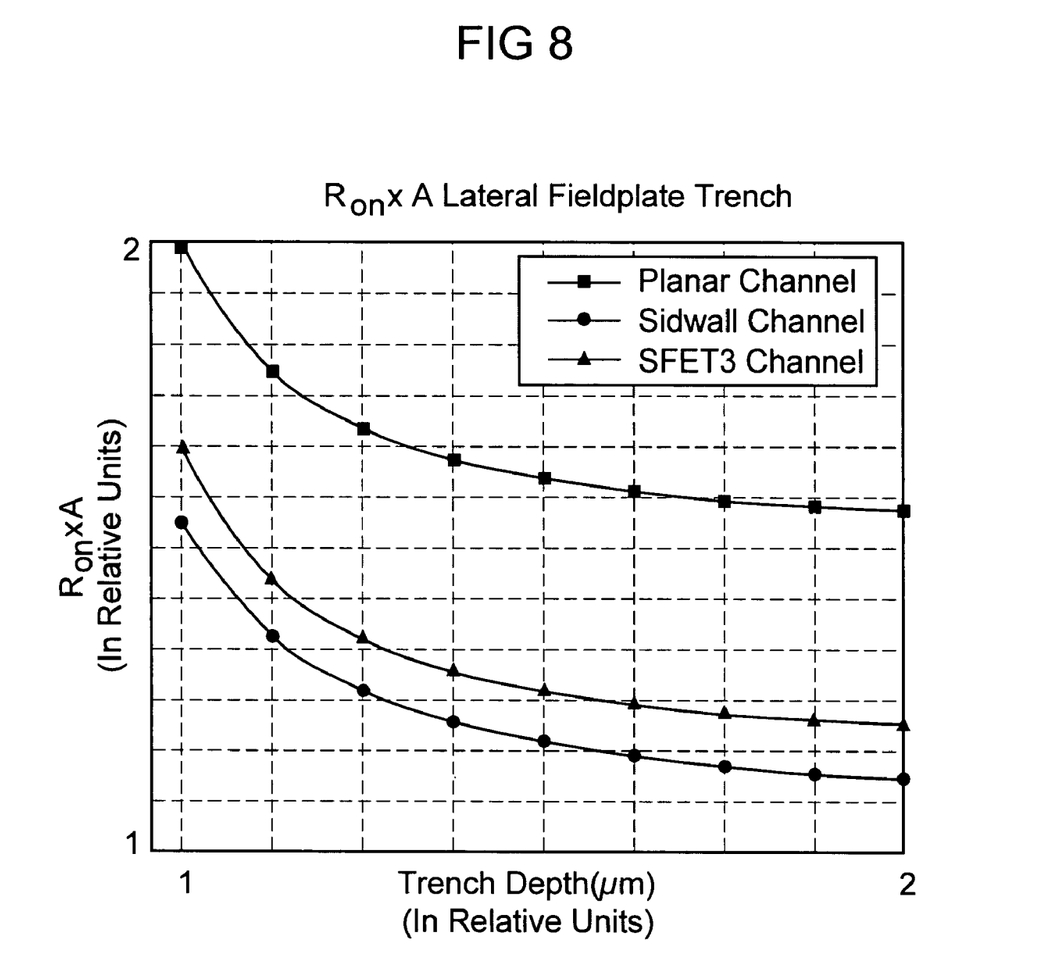
FIG. 8 illustrates the relationship between on resistivity and trench depth for a MOS channel in planar form for a sidewall channel and also for a channel of a semiconductor transistor according to the invention.

The semiconductor transistor according to the invention enables a) a good control of the threshold voltage, b) renders costly development of a new transistor cell unnecessary, since vertical trench cells are known and are manufactured in large numbers. Furthermore, the channel width can be set arbitrarily by means of simple layout measures. Larger channel widths increase the transconductance (delta $I_D$/delta $U_G$, $I_D$=drain current, $U_G$=gate voltage) (see FIG. 8). Smaller channel widths improve the short-circuit strength of the semiconductor transistor. The upper curve shows the on resistivity for the semiconductor transistors illustrated in FIGS. 1 to 4, the middle curve shows the on resistivity for the embodiments according to the invention as illustrated in FIGS. 9 to 12 and the lower curve shows the on resistivity for the semiconductor transistor illustrated in FIGS. 6 to 7.

In one embodiment, a high avalanche strength can be achieved by means of "drawing back the source region" (the lateral extent of the source region in the direction of the drain zone is shortened), since the hole current is extracted upstream of the source regions and cannot bias a parasitic npn transistor upstream, while a complicated $p^+$-type sinker is required in the case of the lateral sidewall channel. The shortening preferably amounts to 1 µm to 3 µm. The semiconductor transistor according to the invention makes it possible to reduce the production costs since, in contrast to the lateral trench sidewall channel, there is no need for any additional plasma etchings over the entire depth of the drift zone, or, for some embodiments, the trench etching also does not proceed over the entire depth of the drift zone. Moreover, it is possibly generally to reduce the number of masks or mask steps.

The concept according to the invention can be used particularly efficiently in the case of transistors for high voltages (e.g. 500 V), since here the additional space requirement of a few µm, in comparison with the length of the drift zone of 50 µm to 100 µm, is of no consequence.

Accordingly, one aspect of the invention is increasing the channel width by "rotating" the channel (from a lateral direction into a vertical direction) and at the same time reducing the spreading resistance (dividing the electron current emerging from the channel by distributing the current over this larger channel width) by reducing current crowding. The invention enables the use of a vertical trench cell (which is distinguished by good threshold voltage control) as a MOS cell of a lateral transistor.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A lateral semiconductor transistor, having a semiconductor body comprising:
  a source region, a body region and a drain region;
  a drift region extending in the lateral direction between the body region and the drain region; and
  a gate embedded within a trench formed in the semiconductor body, and configured to control vertical current flows between the source region and the drift region, wherein a longitudinal orientation of the trench corresponds to a longitudinal orientation of the drift region, wherein a length of the gate comes within a range extending from half the thickness to double a thickness of the drift region.

2. A lateral semiconductor transistor, having a semiconductor body comprising:
  a source region, a body region and a drain region;
  a drift region extending in the lateral direction between the body region and the drain region; and
  a gate embedded within a trench formed in the semiconductor body, and configured to control vertical current flows between the source region-and the drift region, wherein a longitudinal orientation of the trench corresponds to a longitudinal orientation of the drift region, the drift region is pervaded by field electrodes, the field electrodes are provided within trenches formed in the semiconductor body and are insulated from the semiconductor body by insulation layers, and the field electrodes within the trenches arranged one behind the other are at different potentials when a reverse voltage is present.

3. The semiconductor transistor of claim 2, wherein a longitudinal orientation of the trenches containing the field electrodes corresponds to the longitudinal orientation of the drift region.

4. The semiconductor transistor of claim 2, further comprising a plurality of trenches, each trench containing at least one field electrode, and arranged one behind the other with respect to the longitudinal orientation of the drift region.

5. The semiconductor transistor of claim 2, wherein the field electrodes formed within the trenches are connected to floating semiconductor regions provided in the drift region.

6. The semiconductor transistor of claim 2, wherein a plurality of field electrodes are arranged one next to the other and/or one above the other and/or one behind the other within a trench.

7. A lateral semiconductor transistor, having a semiconductor body comprising:
a source region, a body region and a drain region;
a drift region extending in the lateral direction between the body region and the drain region; and
a gate embedded within a trench formed in the semiconductor body, and configured to control vertical current flows between the source region and the drift region, wherein a longitudinal orientation of the trench corresponds to a longitudinal orientation of the drift region, wherein the drift region is pervaded by field electrodes, the field electrodes are provided within trenches formed in the semiconductor body and are insulated from the semiconductor body by insulation layers, wherein at least one gate and at least one field electrode are formed in a common trench, and wherein a length of the gate comes within a range extending from half the thickness to double the thickness of the drift region.

8. The semiconductor transistor of claim 7, wherein at least one gate and at least one field electrode within a common trench are at gate potential.

9. The semiconductor transistor of claim 8, wherein at least one gate and at least one field electrode within a common trench are fused to form a common electrode.

10. A lateral semiconductor transistor, having a semiconductor body comprising:
a source region, a body region and a drain region;
a drift region extending in the lateral direction between the body region and the drain region; and
a gate embedded within a trench formed in the semiconductor body, and configured to control vertical current flows between the source region and the drift region, wherein a longitudinal orientation of the trench corresponds to a longitudinal orientation of the drift region, wherein the drift region is pervaded by semiconductor compensation regions, the doping type of which is complementary to the doping type of the drift region, and wherein the charges present within a compensation region cannot be depleted.

11. The semiconductor transistor of claim 10, wherein the compensation regions are formed as strips whose longitudinal orientation corresponds to the longitudinal orientation of the drift region.

12. The semiconductor transistor of claim 10, wherein the compensation regions are formed in the form of a plurality of layers which are arranged one above the other and are separated from one another by layers of the complementary doping type which represent parts of the drift region.

13. The semiconductor transistor of claim 10, wherein the compensation regions are formed in the form of pillars whose longitudinal orientation runs perpendicular to the longitudinal orientation of the drift region.

14. A lateral semiconductor transistor, having a semiconductor body comprising:
a source region, a body region and a drain region;
a drift region extending in the lateral direction between the body region and the drain region; and
means for controlling vertical current flows between the source region and the drift region including a gate embedded within a trench formed in the semiconductor body, wherein a longitudinal orientation of the trench corresponds to a longitudinal orientation of the drift region, wherein a length of the gate comes within a range extending from half the thickness to double a thickness of the drift region.

15. A semiconductor device comprising:
a lateral semiconductor transistor, having a semiconductor body comprising:
a source region, a body region and a drain region;
a drift region extending in the lateral direction between the body region and the drain region; and
a gate embedded within a trench formed in the semiconductor body, and configured to control vertical current flows between the source region and the drift region, wherein a longitudinal orientation of the trench corresponds to a longitudinal orientation of the drift region, and wherein a length of the gate comes within a range extending from half the thickness to double the thickness of the drift region.

* * * * *